US009679512B2

(12) United States Patent
Zhang et al.

(10) Patent No.: US 9,679,512 B2
(45) Date of Patent: Jun. 13, 2017

(54) SHIFT REGISTER AND DRIVING METHOD THEREOF, GATE DRIVING CIRCUIT, DISPLAY APPARATUS

(71) Applicant: BOE Technology Group Co., Ltd., Beijing (CN)

(72) Inventors: Yuanbo Zhang, Beijing (CN); Seung Woo Han, Beijing (CN); Yun Sik Im, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/911,666

(22) PCT Filed: Jul. 28, 2015

(86) PCT No.: PCT/CN2015/085303
§ 371 (c)(1),
(2) Date: Feb. 11, 2016

(87) PCT Pub. No.: WO2016/141666
PCT Pub. Date: Sep. 15, 2016

(65) Prior Publication Data
US 2017/0046998 A1    Feb. 16, 2017

(30) Foreign Application Priority Data
Mar. 9, 2015  (CN) .......................... 2015 1 0102976

(51) Int. Cl.
*G06F 3/038*  (2013.01)
*G09G 5/00*  (2006.01)
(Continued)

(52) U.S. Cl.
CPC ............. *G09G 3/2092* (2013.01); *G09G 3/20* (2013.01); *G11C 19/28* (2013.01);
(Continued)

(58) Field of Classification Search
None
See application file for complete search history.

(56) References Cited

U.S. PATENT DOCUMENTS

2010/0238143 A1* 9/2010 Liu .......................... G09G 3/20
345/204

FOREIGN PATENT DOCUMENTS

CN        1921016 A     2/2007
CN      103021358 A     4/2013
(Continued)

OTHER PUBLICATIONS

Dec. 2, 2015—International Search Report Appn PCT/CN2015/085303 with Eng Tran of Written Opinion.

*Primary Examiner* — Ilana Spar
*Assistant Examiner* — Kirk Hermann
(74) *Attorney, Agent, or Firm* — Banner & Witcoff, Ltd.

(57) ABSTRACT

A shift register and driving method thereof, gate driving circuit, and display apparatus are provided. The shift register comprises: first input module configured to pull up potential of first node under the effect of signal received by input terminal; output module configured to pull up potential of output terminal under the effect of the potential of the first node; reset module configured to pull down the potential of the first node under the effect of signal received by reset terminal; and output pulling-down module configured to pull down the potential of the output terminal under the effect of first clock signal, wherein the above identified modules are connected to the first node; and second input module configured to connect the input terminal to the first node within operation time of the first input module and the output pulling-down module under the effect of the first clock signal.

20 Claims, 4 Drawing Sheets

(51) Int. Cl.
    *G09G 3/20*           (2006.01)
    *G11C 19/28*        (2006.01)

(52) U.S. Cl.
    CPC ............... *G09G 2300/0408* (2013.01); *G09G 2300/0809* (2013.01); *G09G 2310/0286* (2013.01); *G09G 2310/08* (2013.01)

(56) References Cited

FOREIGN PATENT DOCUMENTS

| | | |
|---|---|---|
| CN | 103226981 A | 7/2013 |
| CN | 103714792 A | 4/2014 |
| CN | 104616617 A | 5/2015 |

\* cited by examiner

SHIFT REGISTER AND DRIVING METHOD THEREOF, GATE DRIVING CIRCUIT, DISPLAY APPARATUS

The application is a U.S. National Phase Entry of International Application No. PCT/CN2015/085303 filed on Jul. 28, 2015, designating the United States of America and claiming priority to Chinese Patent Application No. 201510102976.4 filed on Mar. 9, 2015. The present application claims priority to and the benefit of the above-identified applications and the above-identified applications are incorporated by reference herein in their entirety.

TECHNICAL FIELD

The present disclosure relates to a shift register and a driving method thereof, a gate driving circuit, and a display apparatus.

BACKGROUND

At present, in order to achieve the purpose of low cost and narrow frame, most of display panels adopt technique of gate driver on array (GOA). A conventional GOA circuit is disposed at two sides of an active display area, and needs a black matrix area with a certain width to shade, which results in that the display panel itself has a frame with a certain width. By taking aspects of comfort and operability and so on of users into consideration, a super-narrow fame or frameless is the present consumption and technology trend. However, the GOA circuit mainly realizes the function of a shift register, in the GOA circuit that amorphous silicon (a-Si) or oxide process cannot realize complementary metal oxide semiconductor (CMOS), in general, a circuit structure having a pulling-up node (PU) and a pulling-down node (PD) would be adopted. In order to maintain the normal operation of such circuit structure, a plurality of transistors used to adjust potentials of the pulling-up node and the pulling-down node are always disposed for the pulling-up node and the pulling-down node respectively, such that the number of transistors in each GOA unit would be approximately ten, which is disadvantageous to reduce the frame width occupied by the GOA circuit.

SUMMARY

There are provided in several embodiments of the present disclosure a shift register and a driving method thereof, a gate driving circuit, and a display apparatus, which are configured to solve the problem that a circuit structure having a pulling-up node PU and a pulling-down node PD limit reduction of a frame width occupied by a GOA circuit.

According to a first aspect, there is provided in the present disclosure a shift register, comprising an input terminal, a reset terminal and an output terminal, wherein the shift register further comprises:

a first input module connected to the input terminal and configured to pull up a potential of the first node under the effect of a signal received by the input terminal;

an output module connected to the output terminal and configured to pull up a potential of the output terminal under the effect of the potential of the first node;

a reset module connected to the reset terminal and configured to pull down the potential of the first node under the effect of a signal received by the reset terminal; and an output pulling-down module connected to the output terminal and configured to pull down the potential of the output terminal under the effect of a first clock signal;

wherein the first input module, the output module, the reset module and the output pulling-down module are connected to the first node; and the shift register further comprises a second input module connected to the input terminal and the first node, which is configured to connect the input terminal to the first node within operation time of the first input module and the output pulling-down module under the effect of the first clock signal.

Optionally, the second input module comprises a first transistor, whose gate is connected to the first clock signal, one of a source and a drain is connected to the input terminal, and the other thereof is connected to the first node.

Optionally, the output module comprises a first capacitor and a third transistor, wherein:

one terminal of the first capacitor is connected to the first node, and the other terminal thereof is connected to the output terminal; and a gate of the third transistor is connected to the first node, one of a source and a drain of the third transistor is connected to the output terminal, and the other thereof is connected to a second clock signal.

Optionally, a duty ratio of the second clock signal is smaller than 50%.

Optionally, the shift register further comprises a fourth transistor, whose gate is connected to the reset terminal, one of a source and a drain is connected to the output terminal, and the other thereof is connected to a low level voltage line.

Optionally, the shift register further comprises a second capacitor, whose one terminal is connected to the first node, and the other terminal is connected to the first clock signal.

Optionally, a size of the second capacitor is equal to a size of a parasitic capacitor between the second clock signal and the third transistor.

Optionally, the output pulling-down module comprises a second transistor, whose gate is connected to the first clock signal, one of a source and a drain is connected to the output terminal, and the other thereof is connected to the low level voltage line.

Optionally, the input module comprises a fifth transistor, whose gate is connected to the input terminal, one of a source and a drain is connected to the input terminal, and the other thereof is connected to the first node.

Optionally, the reset module comprises a sixth transistor, whose gate is connected to the reset terminal, one of a source and a drain is connected to the first node, and the other thereof is connected to the low level voltage line.

According to a second aspect, there is further provided in the present disclosure a gate driving circuit, comprising multiple stages of shift register units having an input terminal, a reset terminal and an output terminal. An input terminal of any one of stages of shift register units except a first stage of shift register unit is connected to an output terminal of a previous stage of shift register unit. The shift register unit adopts any one of the shift registers described above.

According to a third aspect, there is further provided in the present disclosure a display apparatus, comprising any one of the gate driving circuit described above.

According to a fourth aspect, there is further provided in the present disclosure a method for driving any of the shift registers, comprising:

in a first phase, inputting a first level to the input terminal, such that the first input module pulls up the potential of the first node under the effect of the first level, and the second input module connects the input terminal with the first node under the effect of the first clock signal, and such that the output module pulls up the potential of the output terminal under the effect of the potential of the first node; and in a second phase, inputting a second level to the input terminal, inputting the second level to the reset terminal, such that the reset module pulls down the potential of the first node, the output pulling-down module pulls down the potential of the output terminal under the effect of the first clock signal, and such that the second input module connects the input terminal with the first node under the effect of the first clock signal.

Optionally, the output module comprises a third transistor, wherein one of a source and a drain of the third transistor is connected to a second clock signal and the other thereof is connected to the output terminal, and a duty ratio of the second clock signal is smaller than 50%.

It can be known from the above technical solution that the shift register of the present disclosure can be taken as the circuit structure of the GOA unit. At this time, the second output module can discharge a noise voltage at the first node (i.e., pulling-up node PU) to the input terminal while the output pulling-down module discharges the potential of the output terminal to the low level voltage line, so that it can be discharged to the low level voltage line via the output terminal of the previous stage of GOA unit and the output pulling-down module in the cascade circuit. Therefore, the present disclosure can also realize the function of the circuit structure having the pulling-up node PU and the pulling-down node PD in the prior art.

Further, the present disclosure removes only the pulling-down node PD, that is, removing the plurality of transistors used to adjust the potential of the pulling-down node in the shift register and the gate driving circuit. Therefore, the number of the transistors used can be reduced, which is advantageous to reduce the frame width occupied by the gate driving circuit.

DETAILED DESCRIPTION

In order to make principles, technical solutions and advantages of embodiments of the present disclosure more clear, embodiments of the present disclosure will be described clearly and completely by combining with the figures. Obviously, the embodiments described below are a part of embodiments but not all of the embodiments. Based on the embodiments of the present disclosure, all of the other embodiments obtained by those ordinary skilled in the art without paying any inventive labor belong to the scope of the present disclosure.

Figure 1:
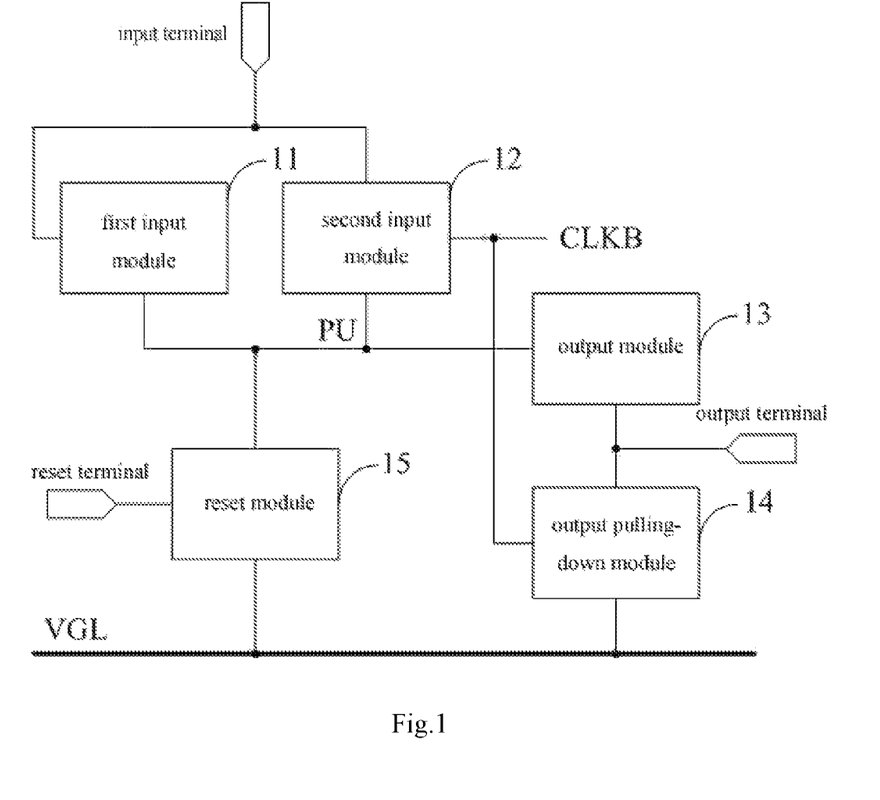
FIG. 1 is a block diagram of a circuit structure of a shift register in an embodiment of the present disclosure.

FIG. 1 is a block diagram of a shift register in an embodiment of the present disclosure. Referring to FIG. 1, the shift register comprises an input terminal, a reset terminal, and an output terminal. Furthermore, the shift register comprises a first input module 11, a second input module 12, an output module 13, an output pulling-down module 14 and a reset module 15, all of which are connected to a first node PU.

In FIG. 1, the first input module 11 is further connected to the input terminal, and configured to pull up potential of the first node PU under the effect of a signal received by the input terminal.

The output module 13 is further connected to the output terminal, and configured to pull down a potential of the output terminal under the effect of the potential of the first node PU.

The reset module 15 is connected to the reset terminal, and configured to pull down the potential of the first node PU under the effect of a signal received by the reset terminal (FIG. 1 exemplarily takes a connection to a low level voltage line VGL as an example to represent the effect of pulling down).

The output pulling-down module 14 is further connected to the output terminal, and configured to pull down the potential of the output terminal under the effect of a first clock signal CLKB (FIG. 1 exemplarily takes the connection to the low level voltage line VGL as an example to represent the effect of pulling down).

The second input module 12 is connected to the input terminal, and configured to connect the input terminal to the first node PU within operation time of the first input module 11 and the output pulling-down module 14 under the effect of the first clock signal CLKB.

It should be noted that clock signals in the text can be divided into two or more clock signals which have the same frequency but staggered phases.

For example, the second input module 12 can connect the input terminal with the first node PU within the operation time of the first input module 11. If the signal received by the input terminal within the same time is at a high level, then the second input module 12 can function as assisting to pull up the potential of the first node PU, such that the time of raising the potential of the first node is shorter. On the other hand, the second input module 12 can connect the input terminal with the first node PU within the operation time of the output pulling-down module 14. Now, the second input module 12 can discharge the noise voltage of the first node PU to the input terminal while the output pulling-down module 14 discharges the potential of the output terminal to the low level voltage line VGL, so that it can be discharged to the low level voltage line VGL via the output pulling-down module and output terminal of the previous stage of GOA unit in the cascade circuit, and thus the first node PU can be discharged to a stable low level smoothly. Additionally, under the control of signals received by the input terminal and the reset terminal, respective modules in the shift register can complete cooperatively the outputting and resetting of signals (i.e., pulling up and pulling down of the potential of the output terminal). Therefore, the embodiments of the present disclosure can also realize the function of the circuit structure having the pulling-up node PU and the pulling-down node PD.

Further, in the embodiments of the present disclosure, the pulling-down node PD are removed, that is, the plurality of transistors used to adjust the potential of the pulling-down node are removed in the shift register and the gate driving circuit. Therefore, the number of the transistors used can be reduced, which is advantageous to reduce the frame width occupied by the gate driving circuit.

It should be noted that since the first input module 11, the second input module 12, the output module 13, the output pulling-down module 14 and the reset module 15 have explicit functions, and obviously have the characteristic of a switch circuit (turning on or turning off the other two terminals under the control of one terminal), they can be realized by those skilled in the art through for example switch elements of transistors and relays or a combination of the switch elements. Furthermore, in the case of maintaining the connecting relationship and function unchanged, those skilled in the art can obtain a variety of different implementations for any one of the first input module 11, the second input module 12, the output module 13, the output pulling-down module 13 and the reset module 15, to which the present disclosure does not limit.

Figure 2:
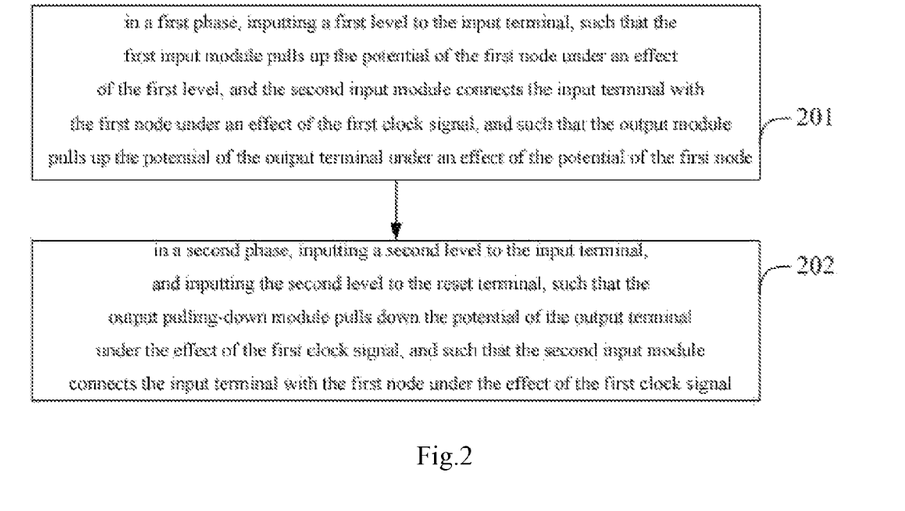
FIG. 2 is a step flow diagram of a driving method of a shift register in an embodiment of the present disclosure.

FIG. 2 is a step flow schematic diagram of a driving method of a shift register in an embodiment of the present disclosure. Referring to FIG. 2, the method comprises following operation processes:

In step 201: during a first phase, a first level is input to the input terminal, such that the first input module pulls up the potential of the first node PU under the effect of the first level, and the second input module connects the input terminal with the first node under the effect of the first clock signal, and enables the output module to pull up the potential of the output terminal under the effect of the potential of the first node PU;

In step 202: during a second phase, a second level is input to the input terminal, and the second level is input to the reset terminal, such that the reset module pulls down the potential of the first node PU, and the output pulling-down module pulls downs the potential of the output terminal under the effect of the first clock signal, and enables the second input module to connect the input terminal with the first node under the effect of the first clock signal.

The method can drive any one of the shift registers so as to realize the function of shifting registering. For example, it is assumed that the first level is the high level and the second level is the low level, referring to FIG. 1, step flows of an exemplary optional driving method can be described as follows:

In a first phase, since the high level signal is input to the input terminal of the shift register, under the effect of the high level received by the input terminal, the first input module 11 performs the function of pulling up the potential of the first node PU; at the same time, under the effect of the first clock signal CLKB, the second input module 12 connects the first node PU with the input terminal, such that the high level received by the input terminal can pull up the potential of the first node PU through the second input module 12, which is equivalent to that the second input module 12 can assist in executing the function of pulling up the potential of the first node PU. After the potential of the first node PU is pulled up, the output module 13 would pull up the potential of the output terminal under the effect of the potential of the first node PU, such that the shift register outputs the high level at the output terminal.

In a second phase, since the low level signal is input to the input terminal, the first input module 11 does not execute the function of pulling up the potential of the first node PU. At the same time, since the high level signal is input to the reset terminal, the reset module 15 executes the function of pulling down the potential of the first node PU (such as making the first node PU connected with the low level voltage line VGL). Furthermore, the output pulling-down module 14 would pull down the potential of the output terminal under the effect of the first clock signal CLKB (such as making the output terminal connected with the low level voltage line VGL), such that the shift register outputs the low level at the output terminal. At the same time, the second input module 12 also connects the first node PU with the input terminal that receives the low level signal under the effect of the first clock signal CLKB, and thus the noise signal of the first node PU can be discharged by the second input module 12 to the input terminal that receives the low level signal, such that the first node PU can be in a stable low level thereafter.

Thus it can be seen that, after the first and second phases, the method provided in the embodiment of the present disclosure can make the output terminal of the shift register firstly output the high level and then output the low level, which is equivalent to that the signal input by the input terminal is output with a delay time, so that the function of the shift register can be realized. Further, in the first phase, the second input module 12 can assist in pulling up the potential of the first node, and in the second phase, the second input module 12 can remove the noise signal at the first node PU, so that the plurality of transistors used to adjust the potential of the pulling-down node PD in the shift register can be removed. In this way, the number of the transistors used therein can be reduced.

Figure 3:
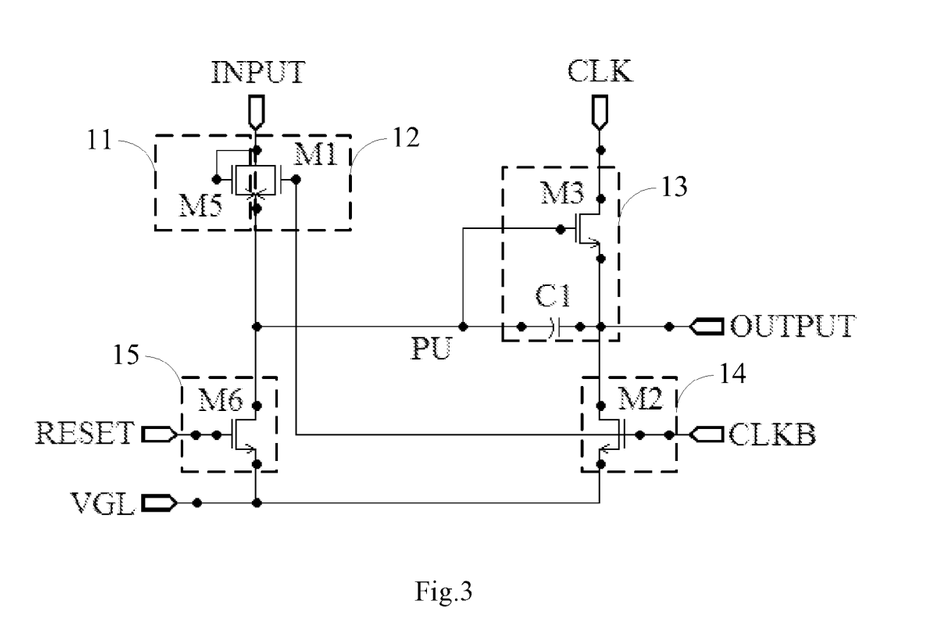
FIG. 3 is a schematic diagram of a circuit structure of a shift register in an embodiment of the present disclosure.

In order to describe an alternative circuit structure and an alternative driving method in shift register in the embodiment of the present disclosure, the following description is given by taking the schematic diagram of the circuit structure of the shift register as shown in FIG. 3 as an example.

Referring to FIG. 3, the second input module 12 can comprise a first transistor M1, whose gate is connected to the first clock signal CLKB, source is connected to the input terminal INPUT, and source is connected to the first node PU.

The first transistor M1 can control a current flowing through the input terminal INPUT and the first node PU under the effect of the first clock signal CLKB, so that the function of the second input module 12 can be realized.

It should be noted that although the transistors in FIG. 3 take N-channel thin film transistors with drains upper and sources below as an example, the transistors may also be transistors of other types. Furthermore, depending on the setting of the high or low level in the specific circuit as well as different types and characteristics of the transistors, sources and drains of the respective transistors can be exchanged with each other totally or exchanged with each other partially, which is easy to be implemented by those skilled in the art according to the actual application, and thus no further description is given herein.

As shown in FIG. 3, the output module 13 can comprise a first capacitor C1 and the third transistor M3. One terminal of the first capacitor C1 is connected to the first node PU, and the other terminal thereof is connected to the output terminal OUTPUT. A gate of the third transistor M3 is connected to the first node PU, a source thereof is connected to the output terminal OUTPUT, and a drain thereof is connected to the second clock signal CLK.

After the potential of the first node PU is pulled up, the third transistor M3 can make a large current flow between the second clock signal CLK that is at the high level and the output terminal OUTPUT, while the first capacitor C1 can maintain a potential difference of its two terminals, such that the potential of the first node PU is further pulled up, and at the same time the potential of the output terminal OUTPUT is pulled up, so as to realize the function that the output module 13 pulls up the potential of the output terminal OUTPUT.

As shown in FIG. 3, the output pulling-down module 14 can comprise a second transistor M2, whose gate is connected to the first clock signal CLKB, drain is connected to the output terminal OUTPUT, and source is connected to the low level voltage line VGL.

The second transistor M2 can control the current flowing from the output terminal OUTPUT to the low level voltage line VGL under the effect of the first clock signal CLKB, so that the function of the output pulling-down module 14 can be realized.

As shown in FIG. 3, the first input module 11 can comprise a fifth transistor M5, whose gate is connected to the input terminal INPUT, drain is also connected to the input terminal INPUT, and source is connected to the first node PU. Thus, when the input terminal INPUT is at the high level, the fifth transistor M5 can make the potential of the first node PU pulled up by the current over the source and drain, so that the function of the first input module 11 is realized.

As shown in FIG. 3, the reset module 15 can comprise a sixth transistor M6, whose gate is connected to the reset terminal RESET, drain is connected to the first node PU, and source is connected to the low level voltage line VGL. Thus, the sixth transistor M6 can control the current from the first node PU to the low level voltage line VGL under the effect of the signal received by the reset terminal RESET, so that the function of the reset module 15 can be realized.

Figure 4:
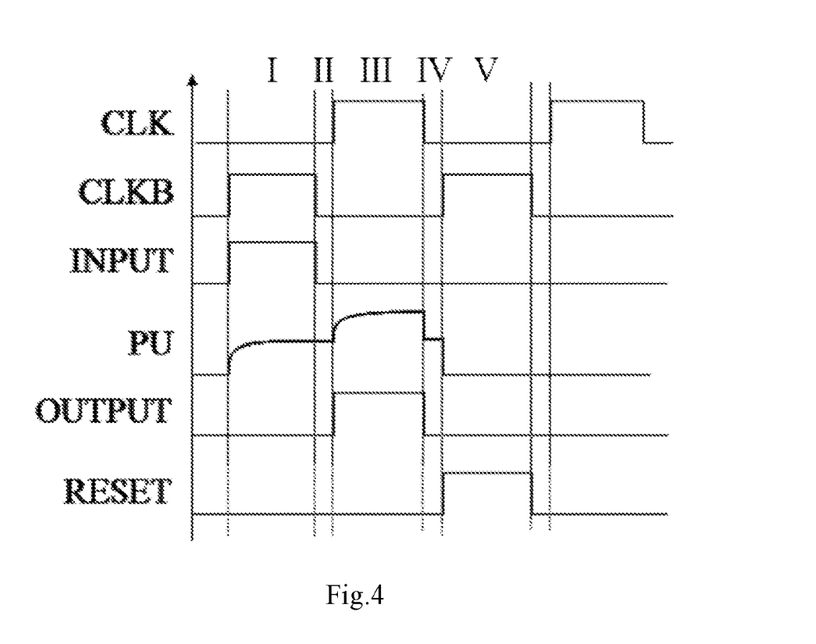
FIG. 4 is a circuit operation timing diagram of a circuit structure of the shift register in FIG. 3.

FIG. 4 is a timing diagram of an operation flow of the circuit structure of the shift register as shown in FIG. 3. It can be seen that the duty ratio of the second clock signal CLK is smaller than 50%. Based on this setting and the circuit structure as shown in FIG. 3, the general operating principle of the shift register is described as follows:

In a first phase I as shown in FIG. 4: the first clock signal CLKB is at the high level, the second clock signal CLK is at the low level, and at the same time the input terminal INPUT is at the high level. Therefore, the first transistor M1 and the fifth transistor M5 jointly charge the first node PU, such that the potential of the first node PU is pulled up to the high level gradually.

In a second phase II as shown in FIG. 4: both the first clock signal CLKB and the second clock signal CLK are at the low level, and at the same time the input terminal INPUT is changed to the low level, so that the first transistor M1 and the fifth transistor M5 are turned off, and the second transistor M2 whose gate is connected to the first clock signal CLKB is also in the turn-off state. Therefore, the potential of the first node PU is still maintained at the high level.

In a third phase III as shown in FIG. 4: the second clock signal CLK is at the high level, the first clock signal CLKB is at the low level, the output module 13 is in an operating state, and the second transistor M2 whose gate is connected to the first clock signal CLKB is also in the turn-off state, so that the potential of the first node PU is further pulled up under a coordinate effect of the first capacitor C1 and the third transistor M3, and thus the potential of the output terminal OUTPUT is raised, and the shift register outputs the high level at the output terminal.

In a fourth phase IV as shown in FIG. 4: both the first clock signal CLKB and the second clock signal CLK are at the low level, and at this time the potential of the drain of the third transistor M3 is changed into the low level, so that the potential of the first node PU is reduced to the previous high level without being further pulled up, and at the same time the output terminal OUTPUT also returns to the previous low level. That is, at this time, the high potential of the output terminal OUTPUT is discharged to the low level through the third transistor M3.

In a fifth phase V as shown in FIG. 4: the first clock signal CLKB is at the high level, the second clock signal CLK is at the low level, and at the same time the signal of the reset terminal RESET is converted into the high level. At this time, the high level of the first node PU is discharged to the low level voltage line VGL through the sixth transistor M6, so as to reduce to the low level, and at the same time, the second transistor M2 further discharges the noise voltage of the output terminal OUTPUT to the stable low level of the low level voltage line VGL under the effect of the first clock signal CLKB, so that the output terminal of the shift register outputs a stable low level thereafter.

Thus it can be seen that, since the duty ratio of the second clock signal CLK is set within a range smaller than 50%, the above fourth phase IV is added to the operation flow of the shift register, such that the output terminal OUTPUT can be discharged to the low level through the third transistor M3 in this phase, and thus the second transistor M2 just functions as removing the noise voltage of the output terminal OUTPUT. Therefore, it does not need a large size, which is advantageous to reduce the width occupied by the gate driving circuit when the shift registers constitute the gate driving circuit.

Of course, the duty ratios of both the first clock signal CLKB and the second clock signal CLK can be 50%, this means that the phases II and IV are removed, and the potential of the output terminal OUTPUT requires to be pulled down through the second transistor M2. However, in order to reduce the time of pulling down, the second transistor M2 needs to have a large size. At the same time, the second transistor M2 having a large size would increase the load of the second clock signal CLK, and then the power consumption of the entire circuit would increase greatly.

Therefore, the above design of making the duty ratio of the second clock signal CLK be smaller than 50% would function as reducing the size required by the second transistor M2, which is advantageous to reduce the width occupied by the gate driving circuit and decrease the power consumption of the entire circuit when the gate driving circuit is composed of the shift registers.

Herein, although the duty ratio of the first clock signal CLKB in FIG. 4 is also smaller than 50%, the added phase II would not make greatly affect on the original operation flow. Therefore, the phase II is not necessary for achieving the above effect, that is, whether the duty ratio of the first clock signal CLKB is 50% may not be limited. Furthermore, since it needs to make the signal output by the output terminal OUTPUT satisfy the requirement, the duty ratio of the second clock signal CLK may have different lower limit values in different actual applications. The specific manner of setting a duty ratio is well known for those skilled in the art, and thus no further description is given herein.

Figure 5:
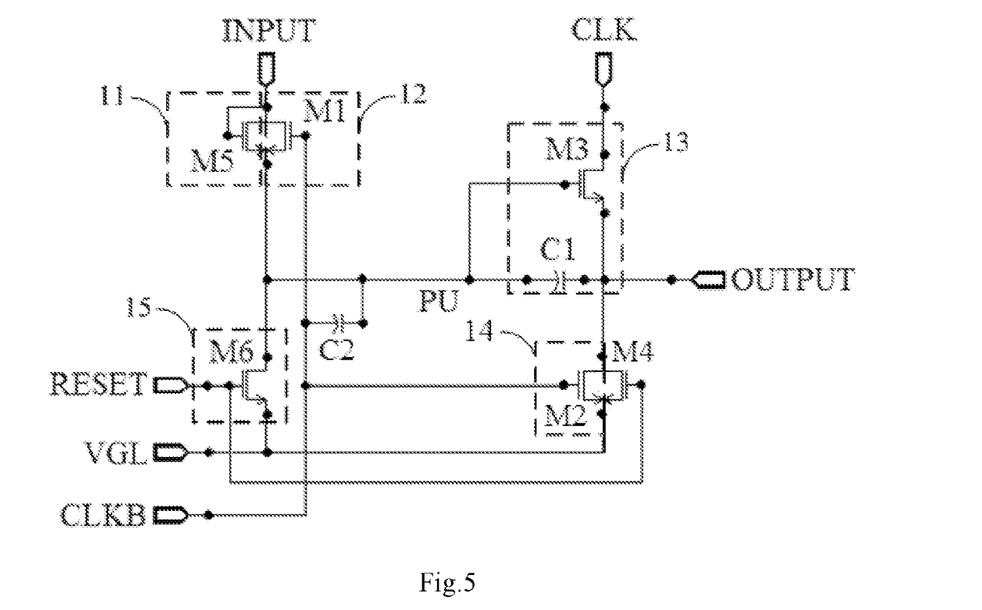
FIG. 5 is a schematic diagram of a circuit structure of a shift register in another embodiment of the present disclosure.

FIG. 5 is a schematic diagram of a circuit structure of a shift register in another embodiment of the present disclosure. Referring to FIG. 5, the shift register adds a fourth transistor M4 and a second capacitor C2 on the basis of the circuit structure as shown in FIG. 3. In FIG. 5, a gate of the fourth transistor M4 is connected to the reset terminal RESET, a drain thereof is connected to the output terminal OUTPUT, and a source thereof is connected to the low level voltage line VGL. One terminal of the second capacitor C2 is connected to the first node PU, and the other terminal thereof is connected to the first clock signal CLKB.

Figure 6:
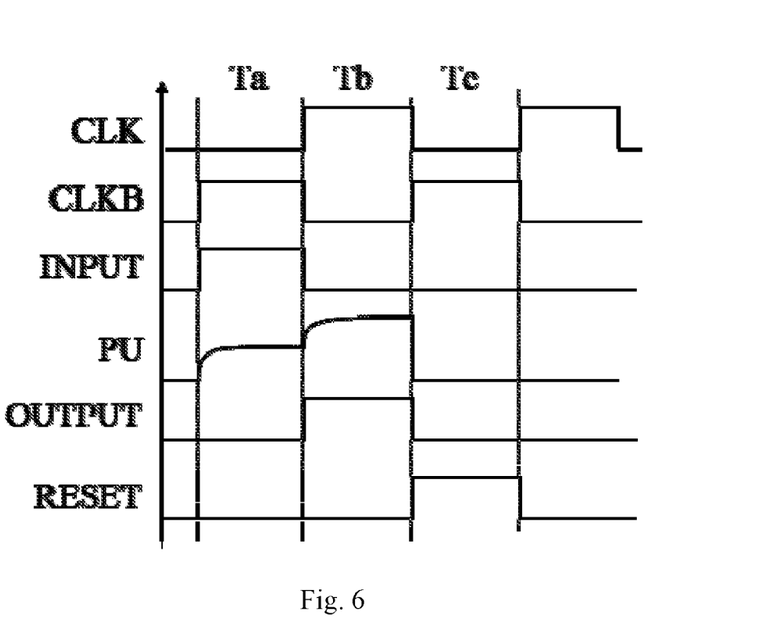
FIG. 6 is a circuit timing diagram of a circuit structure of the shift register in FIG. 5.

FIG. 6 is a timing diagram of an operation flow of the circuit structure of the shift register in FIG. 5. In the operation flow, a phase Ta is the same as the first phase I, a phase Tb is the same as the phase III, a phase Tc is the same as the fifth phase V. In particular, the circuit structures as shown in FIGS. 3 and 5 mainly have a difference in the phase Tc in the aspect of operation principle.

In the circuit as shown in FIG. 5, in the phase Tc as shown in FIG. 6, the first clock signal CLKB is changed from the low level into the high level, the second clock signal CLK is changed from the high level into the low level, and at the same time, the signal received by the reset terminal RESET is changed from the low level into the high level. At this time, the operating mode of the sixth transistor M6 is the same as that in the phase V, while both the fourth transistor M4 and the second transistor M2 are in the turn-on state at this time, and the potential of the output terminal OUTPUT can be pulled down by the two transistors jointly.

Thus, the fourth transistor M4 can be designed as a transistor having a large size, and is mainly used to ensure the normal discharging process of the potential of the output terminal OUTPUT. At the same time, since the size of the second transistor M2 can be set smaller, the load of the second clock signal CLK would not be increased, and thus the power consumption of the circuit is reduced.

Additionally, the setting of the second capacitor C2 can ensure that the moment of the second clock signal CLK changed from the low level to the high level is consistent with the moment of the first clock signal CLKB changed from the high level into the low level. Therefore, the adverse impact caused by the parasitic capacitance produced after the second clock signal CLK is connected to the third transistor M3 can be offset, and the coupling effect made by the second clock signal CLK changed from the low level into the high level on the potential of the first node PU can be offset effectively, so as to prevent error output of the shift register and raise the stability of the circuit. Alternatively, a capacitance value of the second capacitor C2 can be made equal to a capacitance value of the parasitic capacitor produced after the second clock signal CLK is connected to the third transistor M3, so as to achieve better offsetting effect.

Figure 7:
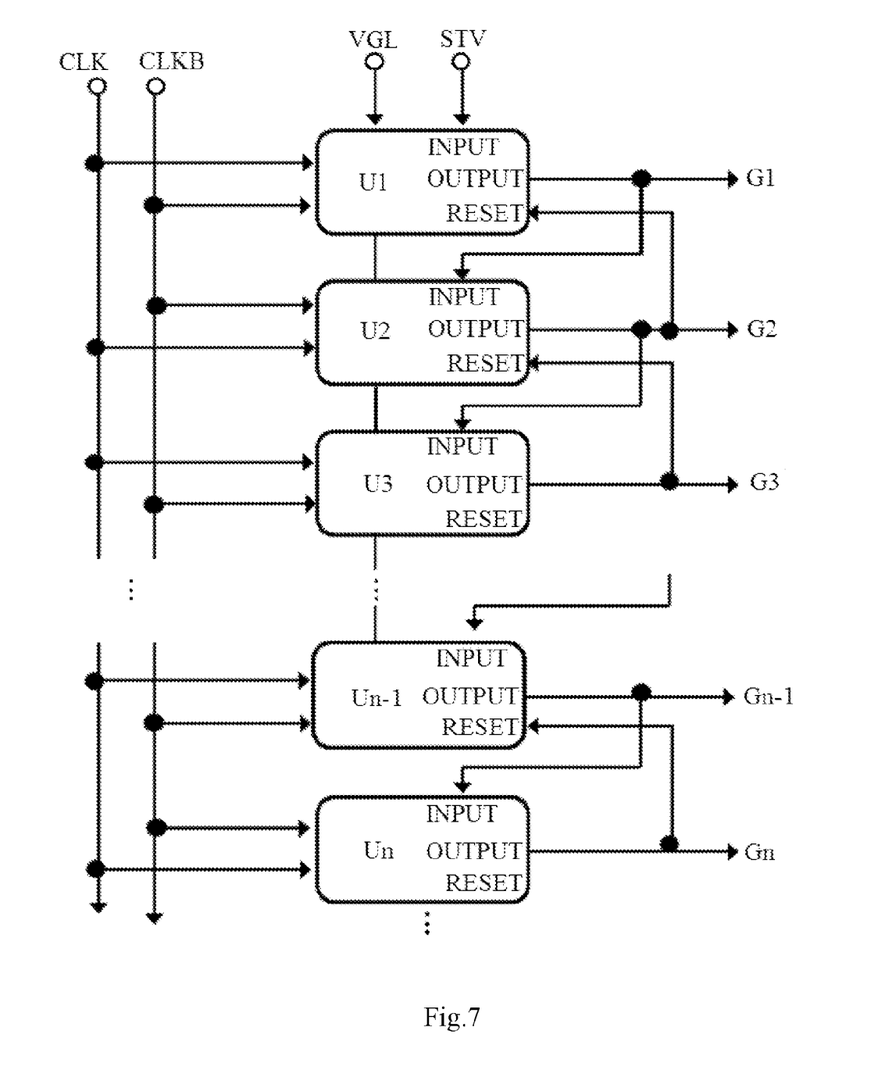
FIG. 7 is a schematic diagram of a structure of a gate driving circuit in an embodiment of the present disclosure.

FIG. 7 is a block diagram of a structure of a gate driving circuit in an embodiment of the present disclosure. The gate driving circuit comprises multiple stages of shift register units (U1, U2, U3 . . . Un-1, Un) having the input terminal INPUT, the reset terminal RESET and the output terminal OUTPUT. Except for that the input terminal INPUT of the first stage of shift register unit U1 is connected with an initial scanning signal STV, the input terminal INPUT of any stage of shift register units (U2, U3, . . . , Un-1, Un) is connected to the output terminal OUTPUT of the previous stage of shift register units (for example, the input terminal INPUT of the shift register unit U3 is connected to the output terminal OUTPUT of the shift register unit U2). Furthermore, the shift register units of the gate driving circuit adopt the circuit structure of any one of the above shift registers.

Additionally, except for that the reset terminal of the last stage of shift register unit is connected to other signals (not shown in FIG. 7), the reset terminal of each stage of shift register units is connected to the output terminal of the next stage of shift register units (for example, the reset terminal RESET of the shift register unit U2 is connected to the output terminal OUTPUT of the shift register unit U3). Furthermore, based on the circuit structure as shown in FIG. 3 or 5, each stage of shift register unit needs to be connected to the first clock signal CLKB, the second clock signal CLK and the low level voltage line VGL.

Based on the above structure, the initial scanning signal can be delivered by the multiple stages of shift register units stage by stage and output as a gate scanning signal (G1, G2, G3, . . . , Gn-1, Gn) in each row.

Further, since the second input module 12 of each stage of shift register unit can connect the first node PU with the output terminal OUTPUT of the previous stage of shift register unit through the input terminal INPUT of the present stage of shift register unit when the output pulling-down module 14 thereof executes the function of pulling down the potential of the output terminal, the noise voltage at the first node PU can be discharged and pulled down by the output pulling-down module 14 in the previous stage of shift register unit at this time, so as to ensure that the potentials of both the first node PU and the output terminal OUTPUT of the present stage of shift register unit are pulled down to a stable low level effectively.

At the same time, it can be seen that the above shift register circuit may be 5T1C (five thin film transistors and one capacitor) or may be 6T2C (six thin film transistors and two capacitors). Compared with the prior art where the shift register circuit always needs approximately ten transistors, the shift register circuit of the present disclosure has smaller number of transistors and in the meantime has some special designs in the size of the respective transistors, so that when the transistors constitute the gate driving circuit, the width occupied by the gate driving circuit can be reduced, which is advantageous to realize the narrow-frame design or even frameless design of the display apparatus.

Based on a same inventive concept, there is provided in an embodiment of the present disclosure a display apparatus. The display apparatus comprises any one of the gate driving circuit described above. The display apparatus can be any product or component having a display function, such as a display panel, a mobile phone, a tablet computer, a TV set, a notebook computer, a digital photo frame, a navigator and so on. In addition, the display apparatus comprises any one of the gate driving circuit described above, and thus can solve the technical problem, and achieve the same technical effect.

It needs to indicate in the description of the present disclosure that, the orientation or position relationship indicated by terms "up" and "down" is the orientation or position relationship as shown in the figures and are only used to make it convenient for describing the embodiments of the present disclosure and simplifying the description, instead of indicating or suggesting that the apparatus or element referred to must have a specific orientation or constructed and operated in a unique direction, and thus these terms cannot be understood as a limitation to the present disclosure. Unless otherwise specified and defines, terms of "install", "connect with" and "connect to" shall be understood broadly. For example, connection may be a fix connection, or may be a detachable connection or may be an integral connection; it may be a mechanical connection or may be an electrical connection; it may be a direct connection or may be a connection through an intermediate media or may be a connection within two elements. For those skilled in the art, the specific meaning in the present disclosure can be understood according to the specific situations.

It further needs to note that the relationship terms such as first and second and so on in this text are just used to distinguish one entity or operation from another entity or operation, but does not require or suggest that any actual relationship or sequence exists among these entities or operations. Furthermore, the terms of "comprise", "include" or any other variant means to cover non-exclusive containing, so that processes, methods, objects or devices comprising a series of elements not only comprise those elements but also comprise the elements not listed explicitly or further comprise elements inherent in these process, methods, objects or devices. In the case of no further limitation, an element defined by "comprising a/an" does not exclude that additional same elements exit in the processes, methods, objects or devices comprising the elements.

The above embodiments are used to specify the technical solutions of the present disclosure but not limit the present disclosure. Although the present disclosure is described in detail by referring to the embodiments described above, those skilled in the art shall understand that they can still amend the technical solutions disclosed in the respective embodiments or equivalently replace a part of technical features; and these amendments or replacements do not make the substance of the corresponding technical solution depart from the spirit and scope of the technical solutions in the respective embodiments of the present disclosure.

The present application claims the priority of a Chinese patent application No. 201510102976.4 filed on Mar. 9, 2015. Herein, the content disclosed by the Chinese patent application is incorporated in full by reference as a part of the present disclosure.

What is claimed is:

1. A shift register comprising: an input terminal, a reset terminal and an output terminal, wherein the shift register further comprises:
   a first input module connected to the input terminal and configured to pull up a potential of a first node under an effect of a signal received by the input terminal;
   an output module connected to the output terminal and configured to pull up a potential of the output terminal under an effect of the potential of the first node;
   a reset module connected to the reset terminal and configured to pull down the potential of the first node under an effect of a signal received by the reset terminal; and
   an output pulling-down module connected to the output terminal and configured to pull down the potential of the output terminal under an effect of a first clock signal,
   wherein the first input module, the output module, the reset module and the output pulling-down module are connected to the first node; and
   the shift register further comprises a second input module connected to the input terminal and the first node and configured to connect the input terminal to the first node within an operation time of the first input module and the output pulling-down module under the effect of the first clock signal.

2. The shift register according to claim 1, wherein the second input module comprises a first transistor, whose gate is connected to the first clock signal, one of a source and a drain is connected to the input terminal, and the other thereof is connected to the first node.

3. The shift register according to claim 1, wherein the output module comprises a first capacitor and a third transistor, wherein:
   one terminal of the first capacitor is connected to the first node, and the other terminal thereof is connected to the output terminal; and
   a gate of the third transistor is connected to the first node, one of a source and a drain of the third transistor is connected to the output terminal, and the other thereof is connected to a second clock signal.

4. The shift register according to claim 3, wherein a duty ratio of the second clock signal is smaller than 50%.

5. The shift register according to claim 3, wherein the shift register further comprises a fourth transistor, whose gate is connected to the reset terminal, one of a source and a drain is connected to the output terminal, and the other thereof is connected to a low level voltage line.

6. The shift register according to claim 5, wherein the shift register further comprises a second capacitor, whose one terminal is connected to the first node, and the other terminal is connected to the first clock signal.

7. The shift register according to claim 6, wherein the second capacitor is equal in magnitude to a parasitic capacitor between the second clock signal and the third transistor.

8. The shift register according to claim 1, wherein the output pulling-down module comprises a second transistor, whose gate is connected to the first clock signal, one of a source and a drain is connected to the output terminal, and the other thereof is connected to a low level voltage line.

9. The shift register according to claim 1, wherein the first input module comprises a fifth transistor, whose gate is connected to the input terminal, one of a source and a drain is connected to the input terminal, and the other thereof is connected to the first node.

10. The shift register according to claim 1, wherein the reset module comprises a sixth transistor, whose gate is connected to the reset terminal, one of a source and a drain is connected to the first node, and the other thereof is connected to a low level voltage line.

11. A gate driving circuit, comprising multiple stages of shift register units having an input terminal, a reset terminal and an output terminal, an input terminal of any stage of the shift register units except for a first stage of shift register unit being connected to an output terminal of a previous stage of shift register unit, wherein the shift register unit adopts the shift register according to claim 1.

12. A display apparatus, comprising the gate driving circuit according to claim 11.

13. A method for driving the shift register according to claim 1, comprising following steps:
   in a first phase, inputting a first level to the input terminal, such that the first input module pulls up the potential of the first node under the effect of the first level, and the second input module connects the input terminal with the first node under the effect of the first clock signal, and such that the output module pulls up the potential of the output terminal under the effect of the potential of the first node; and
   in a second phase, inputting a second level to the input terminal, and inputting the second level to the reset terminal, such that the reset module pulls down the potential of the first node, the output pulling-down module pulls down the potential of the output terminal under the effect of the first clock signal, and such that the second input module connects the input terminal with the first node under the effect of the first clock signal.

14. The gate driving circuit according to claim 11, wherein the second input module comprises a first transistor, whose gate is connected to the first clock signal, one of a source and a drain is connected to the input terminal, and the other thereof is connected to the first node.

15. The gate driving circuit according to claim 11, wherein the output module comprises a first capacitor and a third transistor, wherein:

one terminal of the first capacitor is connected to the first node, and the other terminal thereof is connected to the output terminal; and a gate of the third transistor is connected to the first node, one of a source and a drain of the third transistor is connected to the output terminal, and the other thereof is connected to a second clock signal.

16. The gate driving circuit according to claim 15, wherein a duty ratio of the second clock signal is smaller than 50%.

17. The gate driving circuit according to claim 15, wherein the shift register further comprises a fourth transistor, whose gate is connected to the reset terminal, one of a source and a drain is connected to the output terminal, and the other thereof is connected to a low level voltage line.

18. The gate driving circuit according to claim 17, wherein the shift register further comprises a second capacitor, whose one terminal is connected to the first node, and the other terminal is connected to the first clock signal.

19. The gate driving circuit according to claim 18, wherein the second capacitor is equal in magnitude to a parasitic capacitor between the second clock signal and the third transistor.

20. The gate driving circuit according to claim 11, wherein the output pulling-down module comprises a second transistor, whose gate is connected to the first clock signal, one of a source and a drain is connected to the output terminal, and the other thereof is connected to a low level voltage line.

\* \* \* \* \*